United States Patent
Lin

(10) Patent No.: US 8,537,953 B2
(45) Date of Patent: Sep. 17, 2013

(54) TIME-INTERLEAVED CLOCK-DATA RECOVERY AND METHOD THEREOF

(75) Inventor: Chia-Liang Lin, Fremont, CA (US)

(73) Assignee: Realtek Semiconductor Corp., Hsinchu (TW)

( * ) Notice: Subject to any disclaimer, the term of this patent is extended or adjusted under 35 U.S.C. 154(b) by 1279 days.

(21) Appl. No.: 12/210,190

(22) Filed: Sep. 13, 2008

(65) Prior Publication Data

US 2009/0074125 A1    Mar. 19, 2009

Related U.S. Application Data

(60) Provisional application No. 60/972,254, filed on Sep. 14, 2007, provisional application No. 60/980,787, filed on Oct. 18, 2007.

(51) Int. Cl.
*H03D 3/24* (2006.01)
(52) U.S. Cl.
USPC .......................................... 375/376; 375/373
(58) Field of Classification Search
USPC ......................................................... 375/376
See application file for complete search history.

(56) References Cited

U.S. PATENT DOCUMENTS

| | | | | |
|---|---|---|---|---|
| 6,307,906 B1* | 10/2001 | Tanji et al. | | 375/376 |
| 6,411,665 B1* | 6/2002 | Chan et al. | | 375/360 |
| 6,442,225 B1 | 8/2002 | Huang | | |
| 6,545,507 B1 | 4/2003 | Goller | | |
| 6,700,944 B1 | 3/2004 | Chlipala et al. | | |
| 6,768,385 B2 | 7/2004 | Smith | | |
| 7,076,377 B2 | 7/2006 | Kim et al. | | |
| 7,092,472 B2 | 8/2006 | Stojanovic | | |
| 7,176,721 B2 | 2/2007 | Ho et al. | | |
| 7,257,183 B2 | 8/2007 | Dally et al. | | |
| 7,312,645 B1* | 12/2007 | Brunn | | 327/147 |
| 2003/0091139 A1* | 5/2003 | Cao | | 375/376 |
| 2003/0214335 A1* | 11/2003 | Saeki | | 327/165 |
| 2004/0202261 A1* | 10/2004 | Gregorius | | 375/354 |
| 2004/0202266 A1* | 10/2004 | Gregorius et al. | | 375/355 |
| 2005/0024094 A1* | 2/2005 | Dalton et al. | | 327/47 |
| 2006/0233291 A1* | 10/2006 | Garlepp et al. | | 375/355 |
| 2007/0147569 A1* | 6/2007 | Chang et al. | | 375/373 |
| 2007/0195874 A1* | 8/2007 | Aziz et al. | | 375/233 |
| 2008/0126566 A1* | 5/2008 | Baumgartner et al. | | 709/248 |
| 2010/0135100 A1* | 6/2010 | Chiu | | 365/233.11 |
| 2011/0096884 A1* | 4/2011 | Chatwin | | 375/360 |
| 2011/0135030 A1* | 6/2011 | Bae et al. | | 375/295 |

FOREIGN PATENT DOCUMENTS

TW    I242929    11/2005

* cited by examiner

*Primary Examiner* — Erin File
(74) *Attorney, Agent, or Firm* — McClure, Qualey & Rodack, LLP

(57) ABSTRACT

A clock-data recovery (CDR) that employs a time-interleaved scheme is disclosed. The circuit comprises: a time-interleaved sampler/phase-detector circuit for receiving an input voltage signal and a plurality of clock signals and outputting N-bit data and N phase signals, wherein N is an integer greater than 1; a control circuit, coupled to the time-interleaved sampler/phase-detector circuit, for receiving the N phase signals and converting the N phase signals into a control signal; and a controlled oscillator, coupled to the control circuit, for generating the plurality of clock signals under the control of the control signal. The CDR is used to relax circuit speed requirement by time-interleaving phase detection by using a multi-phase lower speed circuit.

17 Claims, 11 Drawing Sheets

```
if (D ==F) {
    UP = 0;
    DN = 0}
else {
    if (D == E) {
        UP = 1;
        DN = 0}
    else {
        UP = 0;
        DN = 1}
    }
```

TIME-INTERLEAVED CLOCK-DATA RECOVERY AND METHOD THEREOF

CROSS REFERENCE TO RELATED APPLICATIONS

This application claims the benefit of U.S. Provisional Application No. 60/972,254, filed on Sep. 14, 2007 and entitled "TIME-INTERLEAVED CLOCK-DATA RECOVERY AND METHOD THEREOF" and U.S. Provisional Application No. 60/980,787, filed on Oct. 18, 2007 and entitled "TIME-INTERLEAVED ALL-DIGITAL CLOCK-DATA RECOVERY", the contents of which are incorporated herein by reference.

BACKGROUND OF THE INVENTION

1. Field of the Invention

The present invention relates to clock-data recovery (CDR), in particular to CDR that employs a time-interleaved scheme.

2. Description of Related Art

NRZ (non-return to zero) is a simple but widely used modulation scheme for representing a binary data stream by a voltage waveform suitable for transmission over a communication channel. For a binary data stream to be transmitted at a rate of R (in bits per second), the NRZ scheme represents a logical "1" data bit by a voltage pulse of a first level of duration T, and represents a logical "0" data bit by a voltage pulse of a second level of duration T, where T is the reciprocal of R. On the receiving end of the data transmission, a clock-data recovery (CDR) circuit is used to retrieve the binary data stream embedded in the voltage waveform.

FIG. 1A depicts a typical CDR circuit 100 that receives a voltage signal VIN and generates accordingly a recovered clock CLK and a retrieved binary data stream D embedded in the voltage signal VIN. CDR circuit 100 comprises: a sampler/phase-detector circuit 110 for generating the retrieved binary data stream D by sampling the voltage signal VIN using the recovered clock CLK, and also generating a phase signal, embodied by two logical signals UP and DN, to indicate a timing relationship between the voltage signal VIN and the recovered clock; a charge-pump (CP) circuit 120 for converting the two local signals UP and DN into a current signal IOUT; a loop filter (LF) 130 for converting the current signal IOUT into a control voltage signal VCON; and a VCO (voltage controlled oscillator) 140 for generating the recovered clock CLK under the control of the control voltage signal VCON. In a typical embodiment, when UP is asserted, a positive current pulse is generated by CP 120 to increase the control voltage VCON via LF 130; when DN is asserted, a negative current pulse is generated by CP 120 to decrease the control voltage VCO via LF 130. In a typical embodiment of VCO, increasing the control voltage VCON leads to speeding up the recovered clock CLK, while decreasing the control voltage VCON leads to slowing down the recovered clock CLK. When the sampler/phase-detector circuit 110 determines that the recovered clock is too fast (in reference to a timing embedded in the voltage signal VIN), it sets UP=0 and DN=1, indicating the voltage control signal VCON needs to be decreased to slow down the recovered clock CLK. When the sampler/phase-detector circuit 110 determines that the recovered clock is too slow (in reference to a timing embedded in the voltage signal VIN), it sets UP=1 and DN=0, indicating the voltage control signal VCON needs to be increased to speed up the recovered clock CLK. When the sampler/phase-detector circuit 110 is uncertain about the relative relationship between the recovered clock and the timing embedded in the voltage signal VIN, it sets UP=0 and DN=0, indicating the voltage control signal VCON needs to kept unchanged so that the recovered clock is neither sped up or slowed down. In this manner, the timing of the recovered clock is established in a closed-loop manner to track the timing embedded in the voltage signal VIN.

FIG. 1B depicts a typical sampler/phase-detector circuit 110 comprising: a first data flip-flop (DFF) 112 for sampling the voltage signal VIN at a rising edge of the recovered clock CLK to generate the retrieved data stream D; a second DFF 114 for sampling the retrieved data stream D at a rising edge of the recovered clock CLK to generate a delayed data stream F; a third DFF 116 for sampling the voltage signal VIN at a falling edge of the recovered clock CLK to generate a transitional data stream EN; a fourth DFF 118 for sampling the transitional data stream EN at a rising edge of the recovered clock CLK to generate a synchronized transitional data stream E; and a phase-detector logic circuit 119 for generating the two logical signals UP and DN based on the retrieved data stream D, the synchronized transitional data stream E, and the delayed data stream F, in accordance with a "binary phase detection" algorithm illustrated by the C-code shown in FIG. 1C.

To illustrate the principle of the "binary phase detection" algorithm, a typical timing diagram for sampler/phase-detector 110 is shown in FIG. 1D, if the waveforms of the voltage signal VIN, the retrieved data D, the delayed retrieved data F, the transitional data EN, and the synchronized transitional data F were to be observed using an oscilloscope. The waveform of the voltage signal VIN, generally referred to as an "eye diagram," shows two distinct levels, representing the binary nature of the data embedded therein. The binary data embedded in the voltage signal VIN are labeled as $D_n$, $D_{n+1}$, $D_{n+2}$, and so on, where the subscripts represent time indices. Ideally, one would like the rising edge of the recovered clock CLK to align with the center of each data bit, where the "eye" has the greatest opening and the embedded data bits are most easily identified. In this case, the falling edge of the recovered clock CLK will align with data transition. When D is equal to F, the present retrieved data bit is the same as the previous (i.e. delayed) retrieved data bit. In this case, both UP and DN are set to 0, indicating the timing relationship between the voltage signal VIN and the recovered clock is uncertain. When D is not equal to F, the present retrieved data bit is different from the previous (i.e. delayed) retrieved data bit, indicating there is a transition in the voltage signal VIN. In this case, the synchronized transitional data bit E will either side with the present retrieved data bit D, or the previous retrieved data bit F. If E sides with D, it suggests the recovered clock is too slow, in reference with the timing embedded in the voltage signal VIN, and needs to be sped up (i.e. UP=1 and DN=0). If E sides with F, it suggests the recovered clock is too fast, in reference with the timing embedded in the voltage signal VIN, and needs to be slowed down (i.e. UP=0 and DN=1).

In another prior art, U.S. Pat. No. 6,442,225 uses multi-phase clock to eliminate dead-zone of phase detection. Although multiple phase detections are performed, they are used to detect the same data transition point. To be specific, if N=8 and the data rate is 1 data bit per second, then there are 8 phase detections per second using 8-phase 1-Hz clock. U.S. Pat. No. 6,442,225 aims to improve phase detection performance by using multiple phase detections per data transition.

While there are numerous alternative embodiments to sampler/phase-detector 110 in prior art, all embodiments involve using sampling devices such as data flip-flops or latches. When the data stream is to be transmitted at a very high rate (e.g. 10 Giga-bits per second or higher), the sampling devices also need to be operated at a very high rate, and the design may be very difficult to implement.

What is needed is method of a CDR technique that relaxes the requirement on the operational speed of the sampling devices.

BRIEF SUMMARY OF THIS INVENTION

It is one of object of the present invention to provide a clock-data recovery which employs a time-interleaved scheme.

It is one of object of the present invention to provide a clock-data recovery which employs a time-interleaved scheme, where the multiple phase detections are used to detect different data transition points.

It is one of object of the present invention to provide a clock-data recovery which is used to relax circuit speed requirement by time-interleaving phase detection by using a multi-phase lower speed circuit.

In an embodiment, a time-interleaved clock data recovery circuit is disclosed, the circuit comprising: a time-interleaved sampler/phase-detector circuit for receiving an input voltage signal and a plurality of clock signals and outputting N-bit data and N phase signals, wherein N is an integer greater than 1; N charge-pump circuits, coupled to the time-interleaved sampler/phase-detector circuit, for receiving the N phase signals and outputting N current signals, respectively; a filter, coupled to the N charge-pump circuits, for converting the N current signals into a control signal; and a controlled oscillator, coupled to the filter, for generating the plurality of clock signals under the control of the control signal.

In an embodiment, a method of clock data recovery is disclosed, the method comprising: generating a plurality of clock signals using a controlled oscillator under a control from a control signal, wherein N is an integer greater than 1; sampling an input signal using the plurality of clock signals to generate a plurality of intermediate logical signals; choosing every other phase in the plurality of phases to form a plurality of synchronizing clocks; sampling the plurality of intermediate logical signals to generate a plurality of groups of synchronized logical signals; mapping the plurality of groups of synchronized logical signals into a plurality of phase signals, respectively; converting the plurality of phase signals into a plurality of current signals; summing the plurality of current signals into a total current signal; and filtering the total current signal to generate the control signal.

DETAILED DESCRIPTION OF THIS INVENTION

The present invention relates to CDR (clock-data recovery), in particular to a CDR technique that employs that incorporates a time-interleaving scheme. While the specifications described several example embodiments of the invention considered best modes of practicing the invention, it should be understood that the invention can be implemented in many ways and is not limited to the particular examples described below or to the particular manner in which any features of such examples are implemented. In other instances, well-known details are not shown or described to avoid obscuring aspects of the invention.

The CDR according to this present invention is a time-interleaved scheme, where the multiple phase detections are used to detect different data transition points. To be specific, if N=8 and the data rate is 1 data bit per second, then there are only 1 phase detection per second using 8-phase ⅛-Hz clock. (Note that 8-phase ⅛-Hz clock is functionally equivalent to single-phase 1-Hz clock.)

Figure 2A:
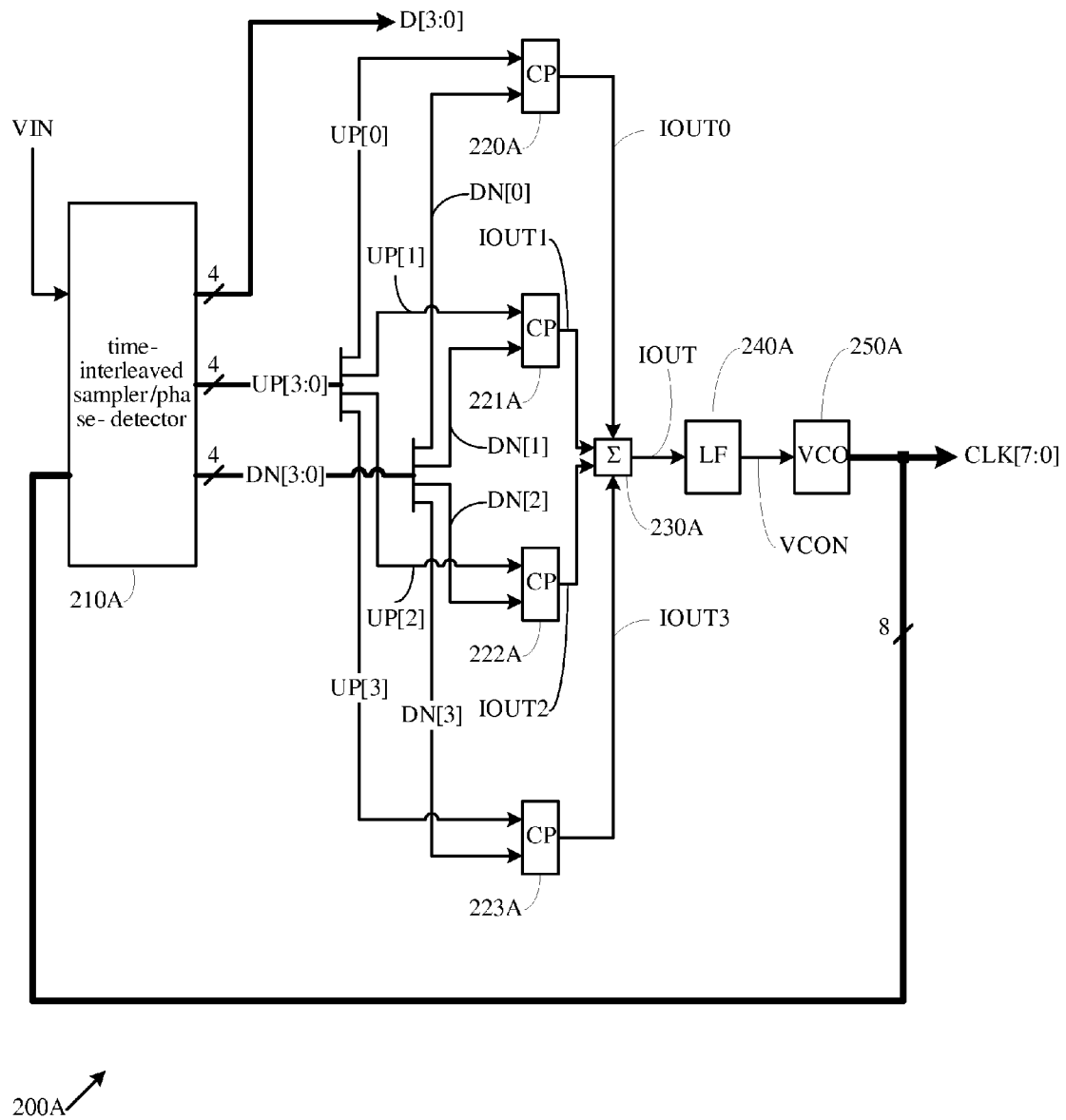
FIG. 2A shows a functional block diagram of a first embodiment of a 4-fold time-interleaved CDR.
Figure 3:
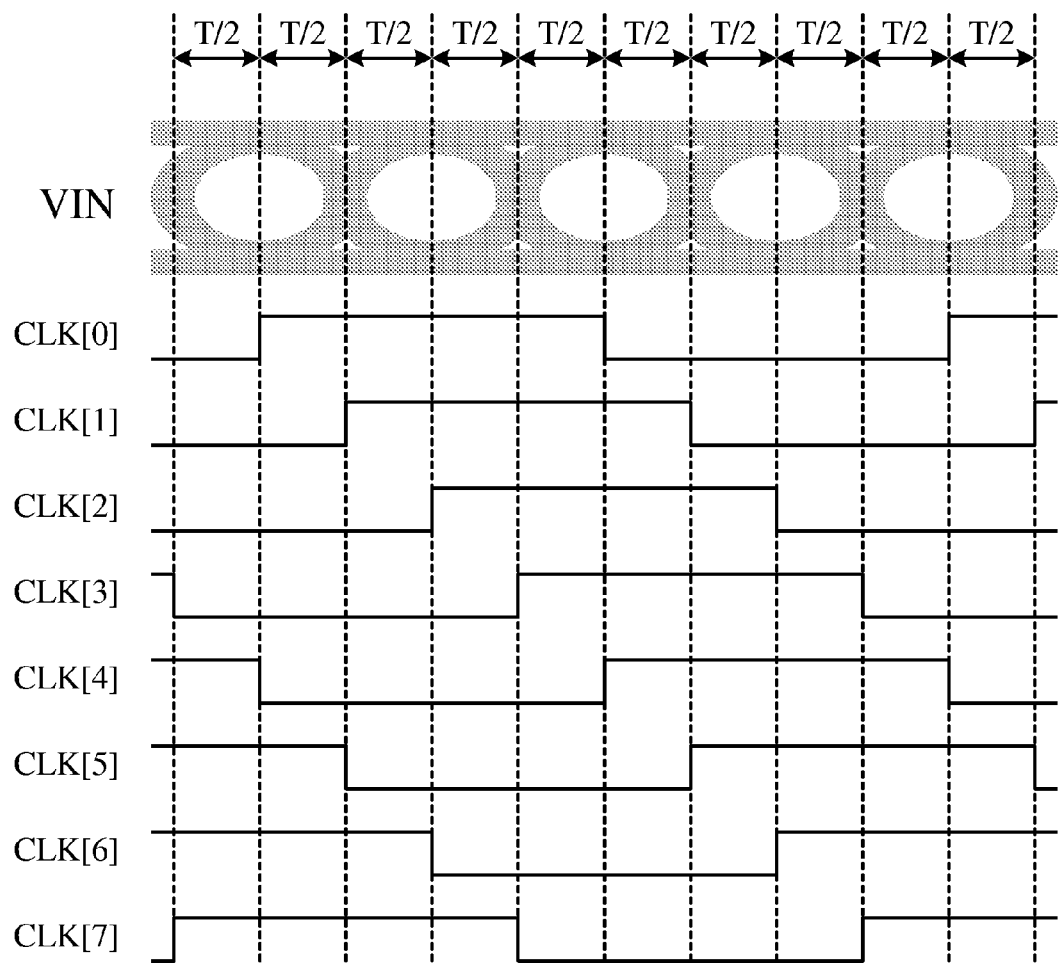
FIG. 3 shows a timing diagram for a 4-told time-interleaved CDR.

The present invention seeks to relax the speed requirement of sampling devices within sampler/phase-detector of a CDR circuit using a time-interleaving scheme. By way of example but not limitation, a 4-fold time-interleaved sampler/phase-detector is used to demonstrate the principle of the present invention. FIG. 2A depicts a CDR circuit 200A in accordance with the present invention, CDR circuit 200A comprising: a time-interleaved sampler/phase-detector circuits 210A for receiving the voltage signal VIN along with a 8-phase clock CLK[7:0] and generating a 4-bit data bus D[3:0] and 4 phase signals embodied by UP[3:0] and DN[3:0]; four charge-pump (CP) circuits 220A, 221A, 222A, and 223A, for receiving the 4 phase signals embodied by 4 logical signal pairs {UP[0], DN[0]}, {UP[1], DN[1]}, {UP[2], DN[2]}, and {UP[3], DN[3]}, respectively, and outputting 4 current signals IOUT0, IOUT1, IOUT2, and IOUT3, respectively; a summation circuit 230A for receiving the 4 current signals from the 4 CP circuits and outputting a total current signal IOUT; a loop filter (LF) circuit 240A for receiving the total current signal IOUT and outputting a control voltage VCON; and a VCO (voltage-controlled oscillator) 250A for generating the 8-phase clock CLK[7:0] in response to the control voltage VCON. The 8-phase clock CLK[7:0] is comprised of eight clocks uniformly spaced in time, each having a period of 4·T, where T is the reciprocal of the data rate (in bits per second) for the binary data embedded in the voltage signal VIN. A timing diagram for the voltage signal VIN and the 8-phase clock CLK[7:0] is depicted in FIG. 3. In a steady state where the CDR circuit 200A settles into, the rising edges of CLK[0], CLK[2], CLK[4], and CLK[6] are aligned with centers of the data embedded in the voltage signal VIN, in a time-interleaved manner, while the rising edges of CLK[1], CLK[3], CLK[5], and CLK[7] are aligned with edges of the data embedded in the voltage signal VIN, also in a time-interleaved manner.

Figure 2B:
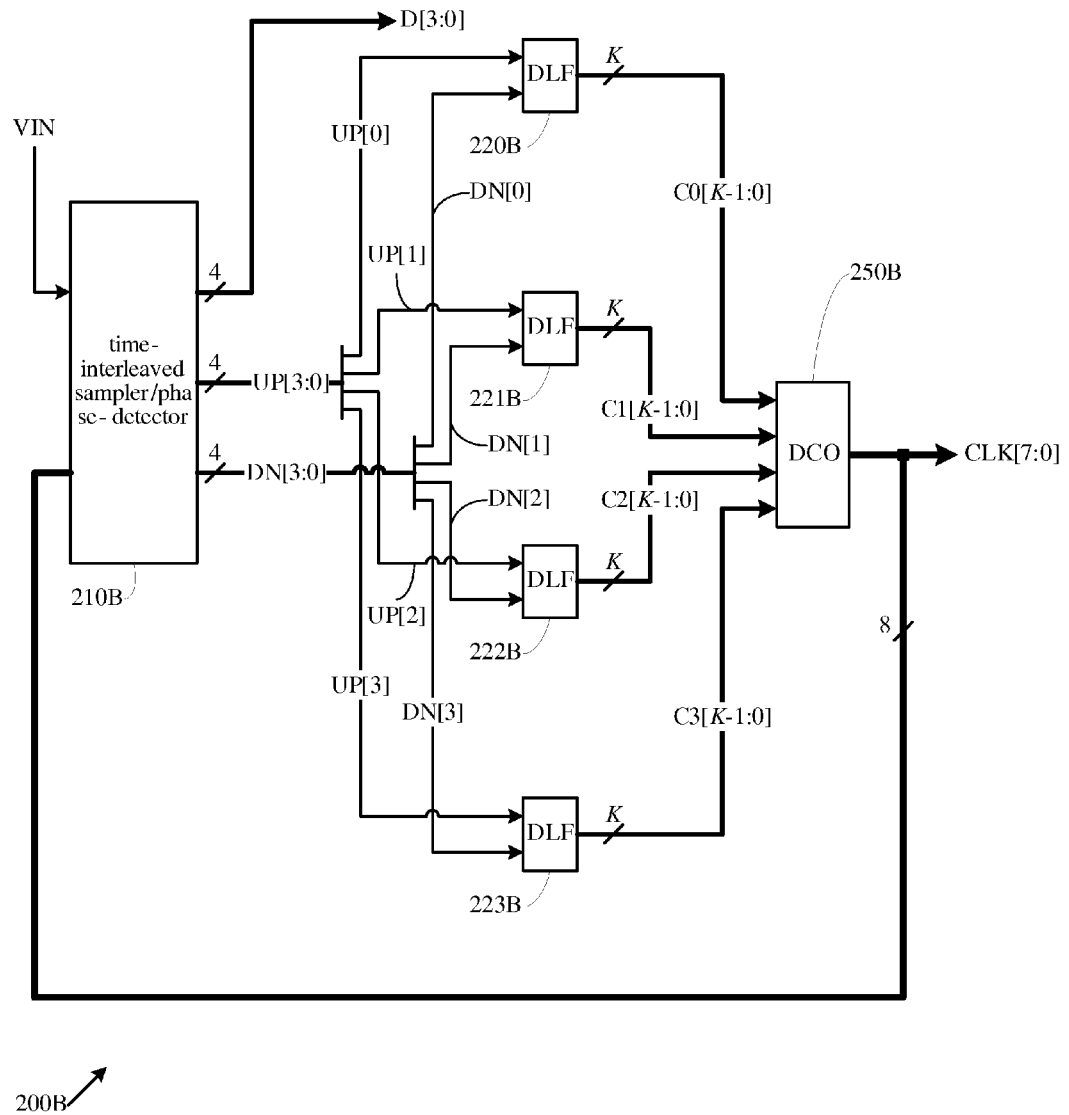
FIG. 2B shows a functional block diagram of a second embodiment of a 4-fold time-interleaved digital CDR circuit.

FIG. 2B depicts a CDR circuit 200B in accordance with the present invention, CDR circuit 200B comprising: a time-interleaved sampler/phase-detector circuits 210B for receiving the voltage signal VIN along with a 8-phase clock CLK[7:0] and generating a 4-bit data bus D[3:0] and four phase signals embodied by UP[3:0] and DN[3:0]; four digital loop filter (DLF) circuits 220B, 221B, 222B, and 223B, for receiving the four phase signals embodied by four logical signal pairs {UP[0], DN[0] }, {UP[1], DN[1] }, {UP[2], DN[2] }, and {UP[3], DN[3] }, respectively, and outputting four K-bit control words C0[K-1:0], C1[K-1:0], C2[K-1:0], and C3[K-1:0], respectively, where K is an integer; and a DCO (digitally-controlled oscillator) 250B for receiving the four K-bit control words C0[K-1:0], C1[K-1:0], C2[K-1:0], and C3[K-1:0] and generating the 8-phase clock CLK[7:0] accordingly. The 8-phase clock CLK[7:0] is comprised of eight clocks uniformly spaced in time, each having a period of 4·T, where T is the reciprocal of the data rate (in bits per second) for the binary data embedded in the voltage signal VIN. A timing diagram for the voltage signal VIN and the 8-phase clock CLK[7:0] is depicted in FIG. 3. In a steady state where the CDR circuit 200B settles into, the rising edges of CLK[0], CLK[2], CLK[4], and CLK[6] are aligned with centers of the data embedded in the voltage signal VIN, in a time-interleaved manner, while the rising edges of CLK[1], CLK[3], CLK[5], and CLK[7] are aligned with edges of the data embedded in the voltage signal VIN, also in a time-interleaved manner.

Figure 1A:
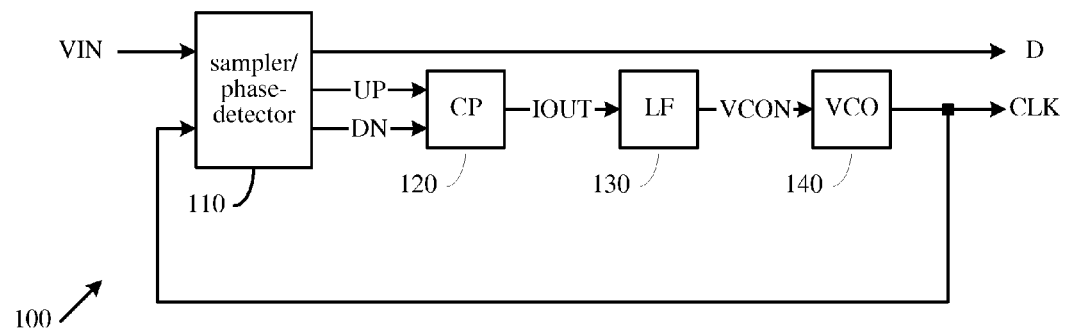
FIG. 1A shows a functional block diagram of a prior art CDR circuit.
Figure 1B:
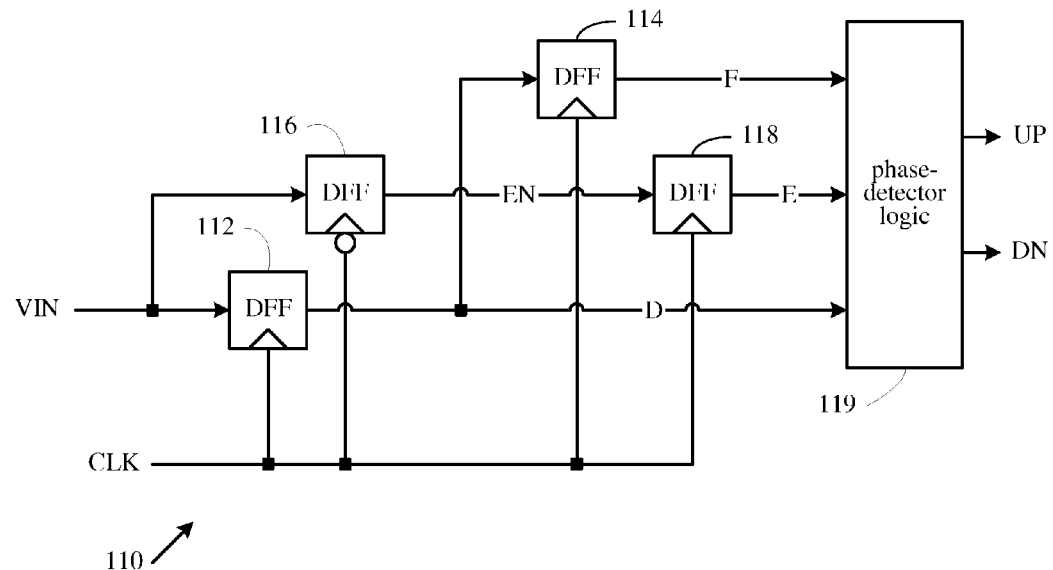
FIG. 1B shows a prior art sampler/phase-detector circuit.
Figures 1C, 1D:
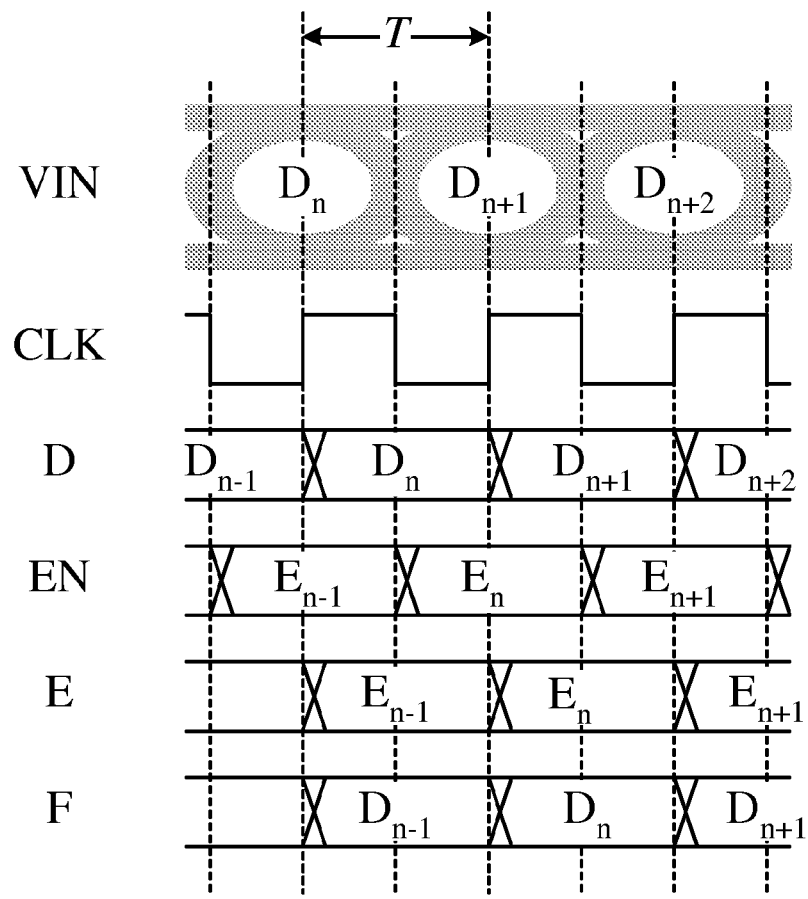
FIG. 1C shows a binary phase detector algorithm written in C language.
FIG. 1D shows a typical timing diagram of sampler/phase-detector 110 in FIG. 1A.
Figure 4:
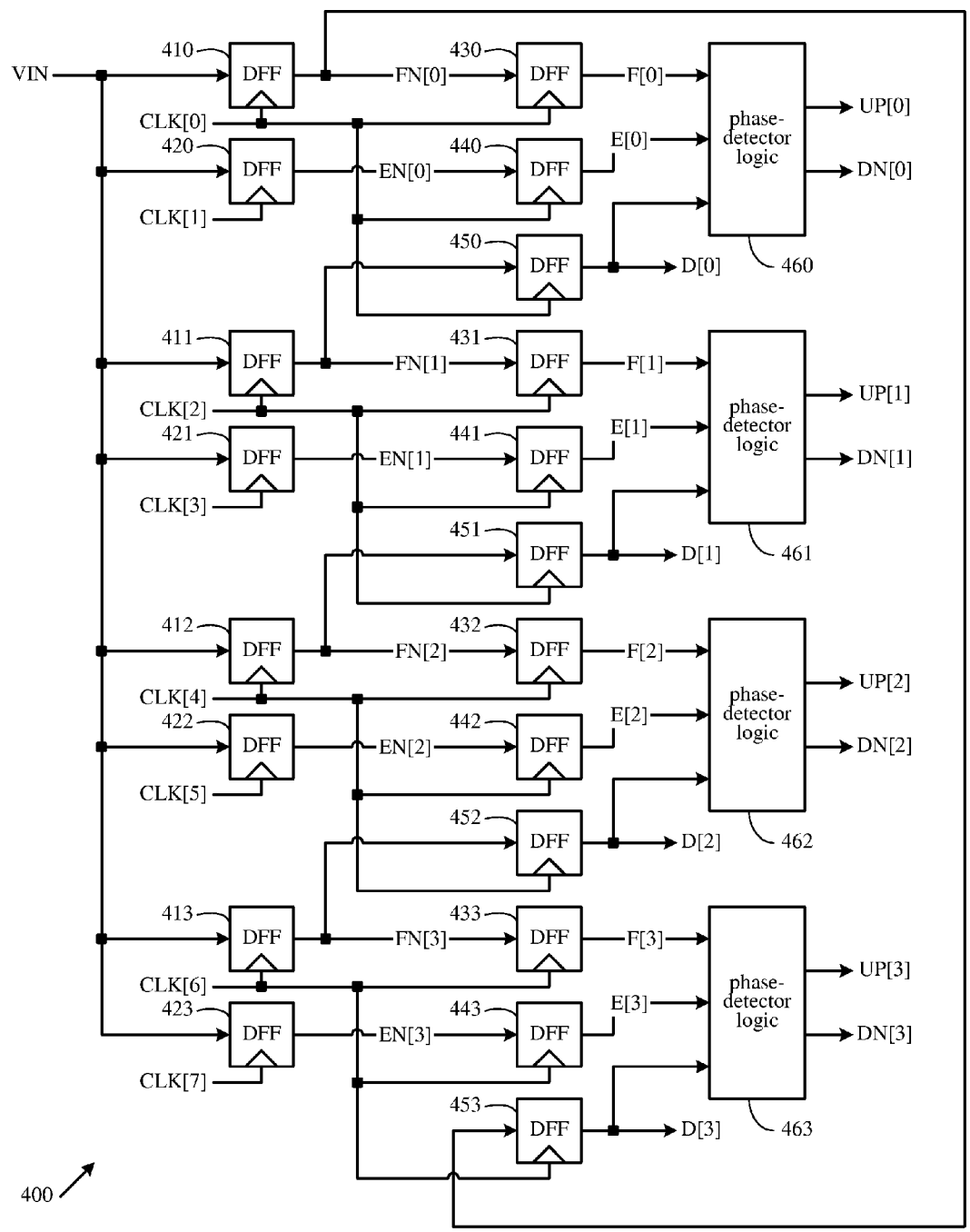
FIG. 4 shows a 4-fold time-interleaved sampler/phase-detector circuit in FIG. 2A or 2B.

An exemplary embodiment 400 for embodying the time-interleaved sampler/phase-detector circuits 210A (or 210B) of FIG. 2A (or 2B) is depicted in FIG. 4. Embodiment 400 comprises: a group of sampling data flip-flops (DFF's) comprising DFF 410, 420, 411, 421, 412, 422, 413, and 423 for sampling the common voltage signal VIN at rising edges of CLK[0], CLK[1], CLK[2], CLK[3], CLK[4], CLK[5], CLK[6], and CLK[7], respectively, and outputting binary data FN[0], EN[0], FN[1], EN[1], FN[2], EN[2], FN[3], and EN[3], respectively; a first group of synchronizing DFF's comprising DFF 430, 440, and 450 for sampling FN[0], EN[0], and FN[1], respectively, at a rising edge of CLK[0] and outputting binary data F[0], E[0], and D[0], respectively; a second group of synchronizing DFF's comprising DFF 431, 441, and 451 for sampling FN[1], EN[1], and FN[2], respectively, at a rising edge of CLK[2] and outputting binary data F[1], E[1], and D[1], respectively; a third group of synchronizing DFF's comprising DFF 432, 442, and 452 for sampling FN[2], EN[2], and FN[3], respectively, at a rising edge of CLK[4] and outputting binary data F[2], E[2], and D[2], respectively; a fourth group of synchronizing DFF's comprising DFF 433, 443, and 453 for sampling FN[3], EN[3], and FN[0], respectively, at a rising edge of CLK[6] and outputting binary data F[3], E [3], and D[3], respectively; a first phase detector logic circuit 460 for receiving F[0], E [0], and D[0] and outputting a first phase signal embodied by logical signal pair UP[0] and DN[0]; a second phase detector logic circuit 461 for receiving F[1], E [1], and D[1] and outputting a second phase signal embodied by logical signal pair UP[1] and DN[1]; a third phase detector logic circuit 462 for receiving F[2], E [2], and D[2] and outputting a third phase signal embodied by logical signal pair UP[2] and DN[2]; and a fourth phase detector logic circuit 463 for receiving F[3], E [3], and D[3] and outputting a fourth phase signal embodied by logical signal pair UP[3] and DN[3]. Phase detector logic circuits 460, 461, 462, and 463 are implemented based on the algorithm illustrate in the C-code shown in FIG. 1C, where "F," "E," and "D," refer to the $1^{st}$, the $2^{nd}$, and the $3^{rd}$ inputs to the phase detector logic, respectively.

Thanks to the time-interleaving nature, the requirement on the circuit speed of the sampling devices (i.e. DFF's in the embodiment 400) is greatly relaxed. For a 4-fold time-interleaving, the requirement on the circuit speed is relaxed by approximately 4 times.

In the CDR circuit 200A of FIG. 2A, the charge-pump is also effectively time-interleaved, and the requirement on the circuit speed is also greatly relaxed. However, the current pulses generated by each charge-pump are longer than in the case where no time-interleaving is used. This stretches the response of the CDR loop to each phase detection. For instance, if a phase detection determines the recovered clock is too slow, a current pulse of duration 4·T (for a 4-fold time-interleaving) is generated to speed up the VCO. This effectively introduces a moving average function on the CDR loop. The moving average makes the CDR loop less noisy, but also less agile in tracking a change in the timing embedded in the voltage signal VIN. So, there is a trade-off between noise and tracking capability. For a 4-fold time-interleaving, however, the drop-off in the tracking capability is very mild. The principle taught by this present invention can be practiced with a higher degree of time-interleaving (say, 8-fold or 16-fold time-interleaving), where the requirement on circuit speed is further relaxed; in this case, the CDR loop is even less noisy, but the tracking capability is further reduced. For a N-fold time-interleaving scheme, where N is an integer greater than 1, a 2·N-phase recovered clock of period N·T is provided for sampling the common voltage signal VIN using 2·N sampling devices to generate 2·N intermediate logical signals; 3·N sampling devices, separated into N groups, each having 3 sampling devices and operating in accordance with a particular phase of the 2·N-phase recovered clock, are used to synchronize the 2·N intermediate logical signals, resulting in N groups of synchronized logical signals, each group comprising 3 logical signals that are synchronized with the particular phase of the 2·N-phase recovered clock that is associated with the group; and N phase detector logic circuits, each mapping one of the N groups of synchronized logical signals into a phase signal embodied by two logical signals.

In FIG. 2A, a 2·N-phase clock can be conveniently generated by a VCO embodied by, for instance, an N-stage ring oscillator, which is well known in prior art and thus not described in detail here. A charge pump circuit can be conveniently embodied by a current source, which is enabled whenever the UP signal is asserted and disabled otherwise, and a current sink, which is enabled whenever the DN signal is asserted and disabled otherwise, where the output of the current source is tied together with the output of the current sink. The detailed circuit implementation of a charge-pump is well known in prior art and thus not described in detail here. A loop filter can be embodied, for instance, by a parallel connection of a capacitor and a series RC circuit.

In FIG. 2A, summing circuit 230A is used to sum the four current signals IOUT0, IOU1, IOUT2, and IOUT3 into the total current signal IOUT. In practice, however, the outputs of the four CP circuits 220A, 221A, 222A, and 223A can be directly tied together and their respective output current signals are effectively summed without using an explicit summing circuit. In other words, the function of the summing circuit can be realized without using an explicit summing circuit. Similarly, various functional blocks shown in this disclosure can be practiced with alternative embodiments without departing from the scope of the present invention, as long as the functionalities are preserved.

In the CDR circuit 200B of FIG. 2B, the digital loop filter (DLF) is also effectively time-interleaved, and the requirement on the circuit speed is also greatly relaxed. However, the K-bit control word generated by each DLF is longer than in the case where no time-interleaving is used. This stretches the response of the CDR loop to each phase detection. For instance, if a phase detection determines the recovered clock is too slow, a control word of a duration of four times of the duration of each data bit is generated to speed up the DCO. This effectively introduces a moving average function on the CDR loop. The moving average makes the CDR loop less noisy, but also less agile in tracking a change in the timing embedded in the voltage signal VIN. So, there is a trade-off between noise and tracking capability. For a 4-fold time-interleaving, however, the drop-off in the tracking capability is very mild. The principle taught by this present invention can be practiced with a higher degree of time-interleaving (say, 8-fold or 16-fold time-interleaving), where the requirement on circuit speed is further relaxed; in this case, the CDR loop is even less noisy, but the tracking capability is further reduced. For a N-fold time-interleaving scheme, where N is an integer greater than 1, a 2·N-phase recovered clock of period N·T is provided for sampling the common voltage signal VIN using 2·N sampling devices to generate 2·N intermediate logical signals; 3·N sampling devices, separated into N groups, each having 3 sampling devices and operating in accordance with a particular phase of the 2·N-phase recovered clock, are used to synchronize the 2·N intermediate logical signals, resulting in N groups of synchronized logical signals, each group comprising 3 logical signals that are synchronized with the particular phase of the 2·N-phase recovered clock that is associated with the group; and N phase detector logic circuits, each mapping one of the N groups of synchronized logical signals into a phase signal embodied by two logical signals.

Figure 5:
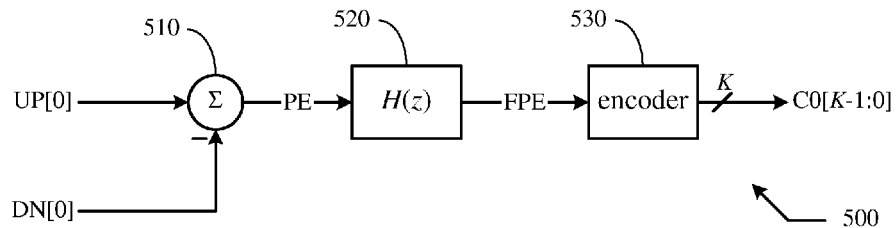
FIG. 5 shows a functional block diagram of a digital loop filter.

FIG. 5 shows a functional block diagram of a digital loop filter 500 suitable for embodying DLF 220B of FIG. 2B (and also suitable for embodying 221B, 222B, and 223B, only that the input/output signal names are different). Digital loop filter 500 includes: a summing circuit 510 for receiving the phase signal UP[0] and DN[0] and outputting a first intermediate signal PE such that PE=UP[0]-DN[0]; a digital filter 520 having a transfer function H(z) for receiving the first intermediate signal PE and outputting a second intermediate signal FPE; and an encoder 530 for encoding the second intermediate signal FPE into the K-bit control word C0[K-1:0]. In an embodiment, the transfer function H(z) is set to $$H(z)=a \cdot z^{-1}+b \cdot z^{-1}/(1-z^{-1})$$

where a and b are two filter parameters. In general, both a and b are fractional numbers and therefore the resultant output of the filtering will be an unbounded mixed number (i.e. an integer plus a fraction) if no constraint is imposed. An embedded rounding and saturation function (not explicitly shown in the figure) is used within digital filter 520 to constrain the second intermediate signal FPE to be a bounded integer. By way of example but not limitation, FPE is an integer bounded between 0 and 255, inclusively. In an embodiment, encoder 530 is a thermometer-code encoder. For instance, when FPE is an integer bounded between 0 and 255, inclusively, the output of a thermometer-code encoder will be a 255-bit control word, where the total number of bits that are "1" is equal to the value of FPE. The principle of thermometer-code encoder and its implementation are well known in the prior art and thus not described in detail here.

Figure 6:
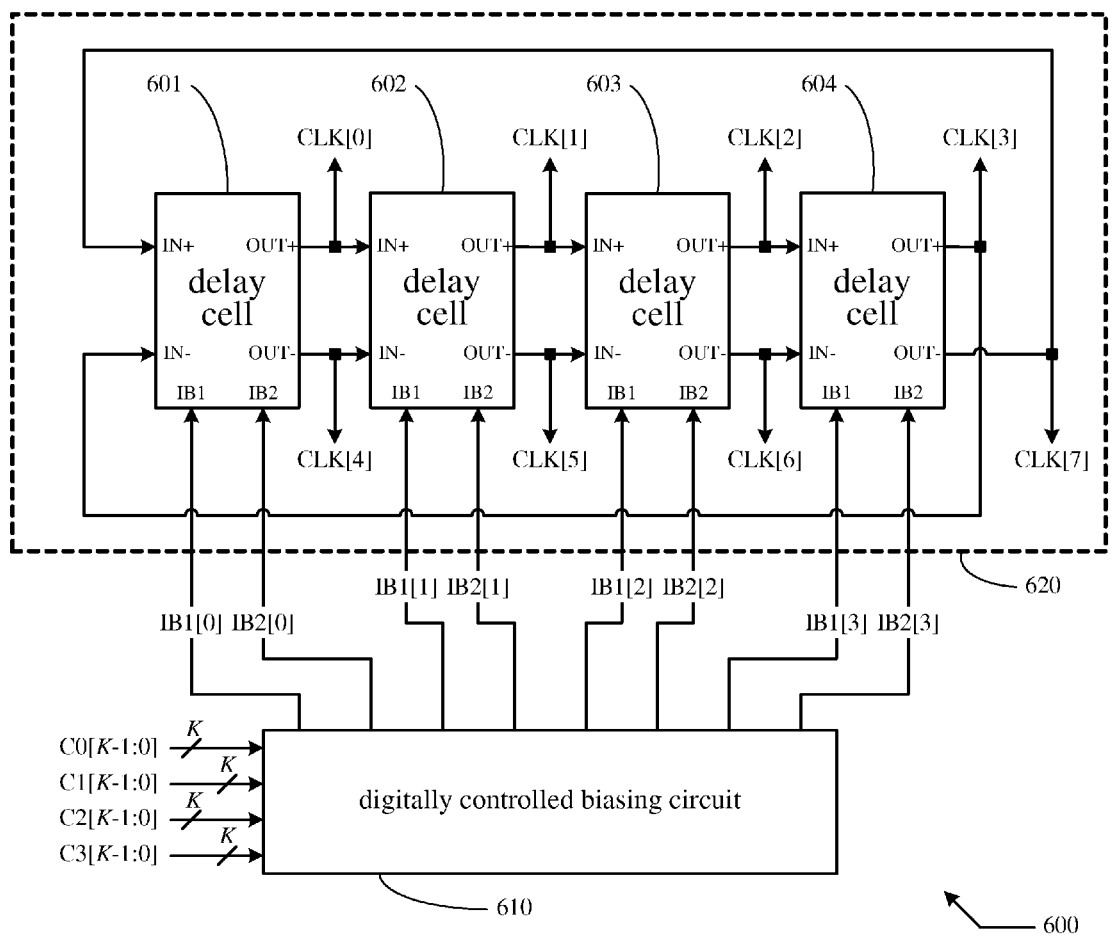
FIG. 6 shows a schematic diagram of a digitally controlled oscillator (DCO).

FIG. 6 shows a block diagram of a DCO 600 suitable for embodying DCO 250B of FIG. 2B. DCO 600 includes a 4-stage ring-oscillator 620 comprising four delay cells (601-604) for outputting the 8-phase clock CLK[7:0]. Each of the four delay cells (601-604) has two input terminals "IN+" and "IN−" for receiving two outputs from a preceding stage of delay cell, two output terminals "OUT+" and "OUT−" for delivering two outputs to a succeeding stage of delay cell, and two bias terminals "IB1" and "IB2" for receiving two biasing currents. To be specific, delay cell 601 receives biasing currents IB1[0] and IB2[0], delay cell 602 receives biasing currents IB1[1] and IB2[1], delay cell 603 receives biasing currents IB1[2] and IB2[2], and delay cell 604 receives biasing currents IB1[3] and IB2[3]. In a preferred embodiment, the four delay cells (601-604) are identical and biased under the same condition. DCO 600 further includes a digitally controlled biasing circuit 610 for receiving the four K-bit control words C0[K-1:0], C1[K-1:0], C2[K-1:0], and C3[K-1:0] and for generating the eight biasing currents IB1[3:0] and IB2[3:0] to provide biasing for the four delay cells (601-604) of the ring-oscillator 620. The four K-bit control words control the biasing condition for the ring-oscillator 620 through the digitally controlled biasing circuit 610, and therefore control the oscillation frequency of the ring-oscillator 620.

Figure 7:
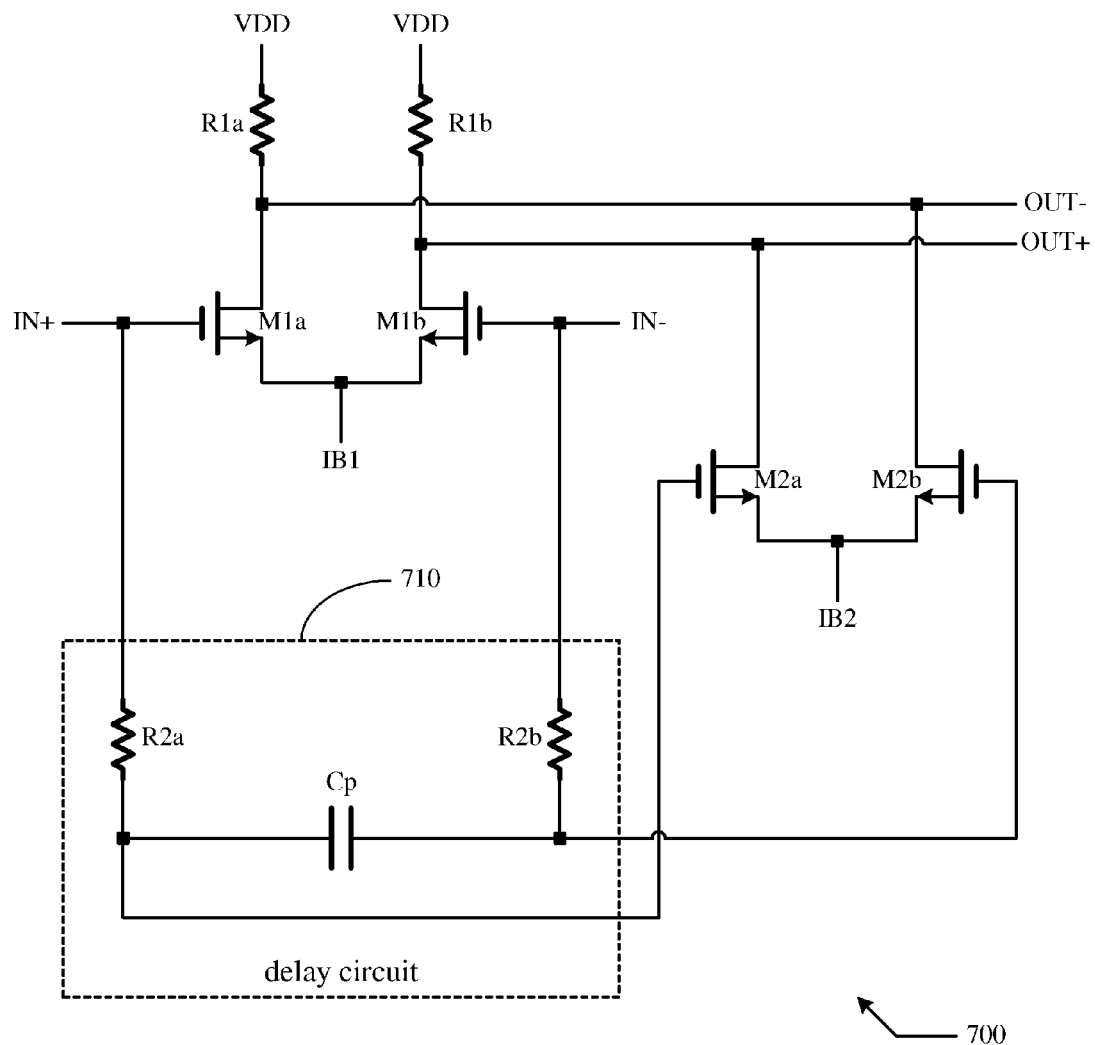
FIG. 7 shows a schematic diagram of a delay cell.

FIG. 7 depicts a schematic diagram of a delay cell 700 suitable for embodying delay cells 601-604 in ring oscillator 620 of FIG. 6. Delay cell 700 is a differential circuit having two input terminals IN+ and IN− and two output terminals OUT+ and OUT−, and receiving a first biasing current through a first bias terminal IB1 and a second biasing current through a second bias terminal IB2. Delay cell 700 includes a first differential pair comprising NMOS (n-channel metal-oxide semiconductor) transistors M1$a$ and M1$b$ biased by the first biasing current (from the IB1 terminal) and a second differential pair comprising NMOS transistors M2$a$ and M2$b$ biased by the second biasing current (from the IB2 terminal). Delay cell 700 also includes a differential delay circuit comprising resistors R2$a$ and R2$b$ and capacitor Cp. Delay cell 700 further includes a pair of load resistors R1$a$ and R1$b$ provided as a common differential load for both the first differential pair M1$a$-M1$b$ and the second differential pair M2$a$-M2$b$. Throughout this disclosure, VDD denotes a first fixed-potential circuit node. The input terminals ("gate" terminals) of the first differential pair M1$a$-M1$b$ are directly coupled to the input terminals IN± of the delay cell 700, while the input terminals ("gate" terminals) of the second differential pair M2$a$-M2$b$ are indirectly coupled to the input terminals IN± of the delay cell 700 via the differential delay circuit 710. The output terminals ("drain" terminals) of both the first differential pair M1$a$-M1$b$ and the second differential pair M2$a$-M2$b$ are directly coupled to the output terminals OUT± of the delay cell 700. In this manner, the outputs OUT± are coupled to the inputs IN± via a first path comprising the first differential pair M1$a$-M1$b$ and a second path comprising the delay circuit 710 and the second differential pair M2$a$-M2$b$. The first path has a first delay, while the second path has a second delay, which is usually greater than the first delay due to the differential delay circuit 710. The overall delay (between the input IN± and the output OUT±) of delay cell 700 is between the first delay and the second delay, and is determined by the relative weights of the two paths. The weights of the first path and the second path are determined by the first biasing current (from IB1) and the second biasing current (from IB2), respectively. In a preferred embodiment, the total current from terminals IB1 and IB2 is constant. In a first extreme case where the current from terminal IB2 is zero (and therefore the second path has zero weight), the overall delay of delay cell 700 is the same as the first delay. In a second extreme case where the current from terminal IB1 is zero (and therefore the first path has zero weight), the overall delay of delay cell 700 is the same as the second delay. A change in the relative currents for the two paths leads to a change in the total delay, and thus leads to a change in the oscillation frequency of the ring-oscillator constructed from this delay cell.

Figure 8:
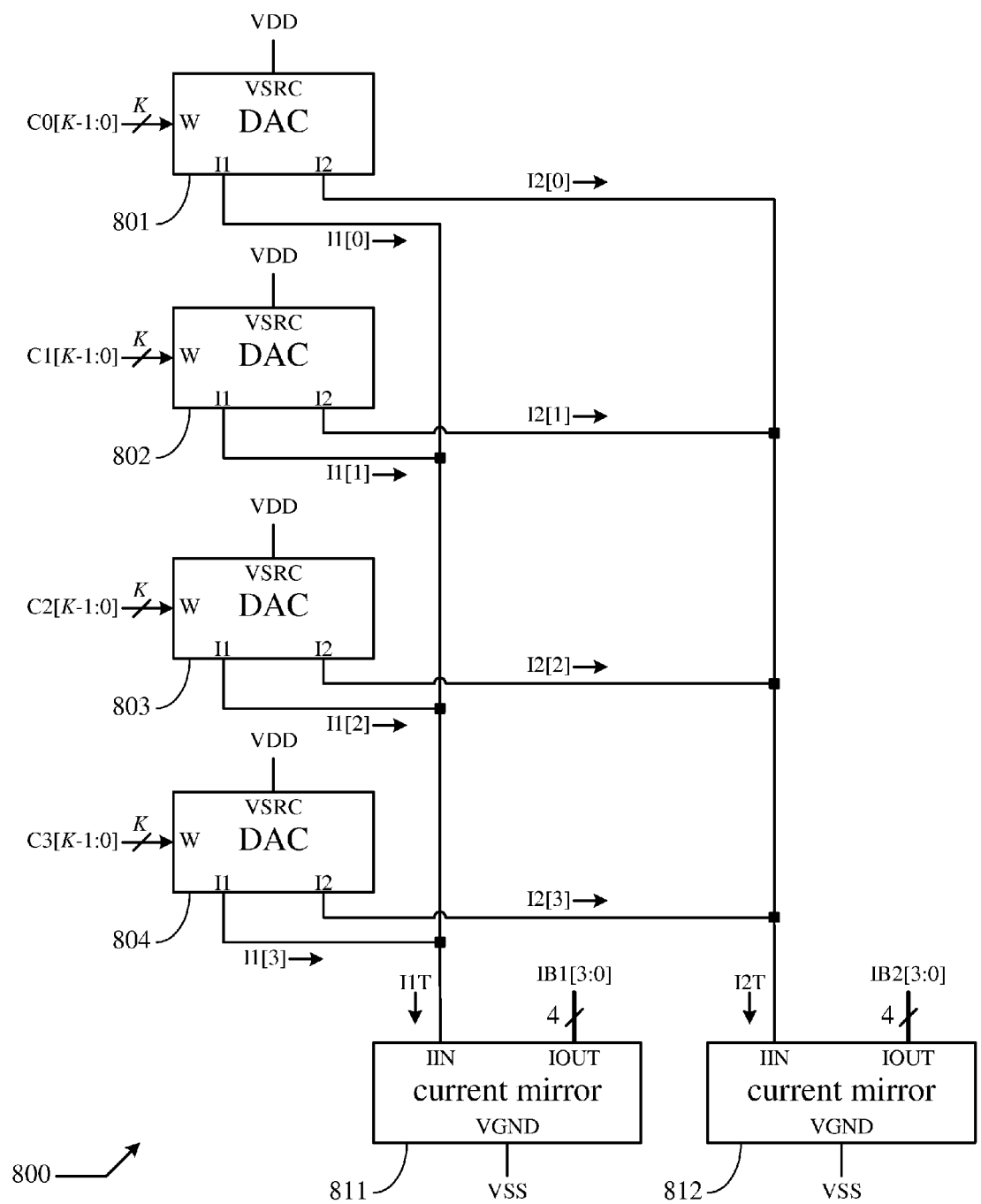
FIG. 8 shows a schematic diagram of a digitally controlled biasing circuit.

FIG. 8 depicts a schematic diagram of a digitally controlled biasing circuit 800 suitable for embodying the digitally controlled biasing circuit 610 in FIG. 6. Biasing circuit 800 includes: four current-mode DAC (digital-to-analog converters) 801-804 for receiving four K-bit control words C0[K-1:0], C1[K-1:0], C2[K-1:0], and C3[K-1:0], respectively, and two current mirror 811 and 812. Each of the four current-mode DACs (801-804) has an input terminal "W" for receiving a K-bit control word, a power supply terminal "VSRC" for receiving power from a first fixed-potential node VDD, and two output terminals "I1" and "I2" for transmitting two output currents. All output currents transmitted from the "I1" terminals (of all four DACs) are merged into a first total current I1T, and all output currents transmitted from the "I2" terminals (of all four DACs) are merged into a second total current I2T. Each of the two current mirrors (811, 812) has an input terminal "IIN" for receiving an input current, an output terminal "IOUT" terminal for transmitting a bus of mirrored output currents, and a power supply terminal "VGND" for coupling to a second fixed-potential node VSS to provide a return path for the power supply. To be specific, current mirror 811 receives the first total current I1T and mirrors it into output currents IB1[0], IB1[1], IB1[2], and IB1[3], while current mirror 812 receives the second total current I2T and mirrors it into output currents IB2[0], IB2[1], IB2[2], and IB2[3]. Note that IB1[3:0] and IB2[3:0] are provided for biasing a 4-stage ring-oscillator in a manner shown in FIG. 6.

Figure 9:
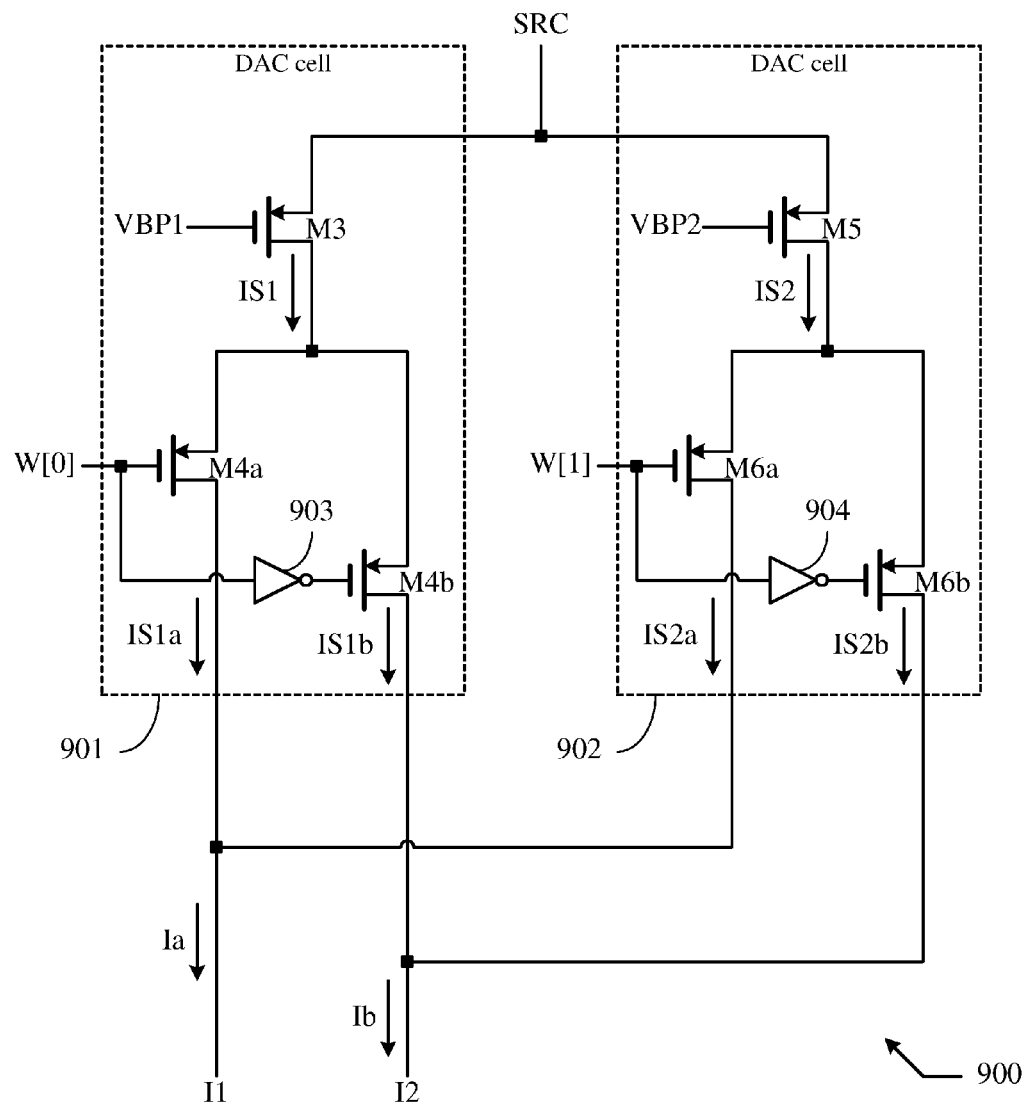
FIG. 9 shows a schematic diagram of a current-mode digital-to-analog converter.

FIG. 9 depicts a schematic diagram of a current-mode DAC 900 suitable for embodying DAC 801-804 of FIG. 8. As mentioned earlier, each of the four current-mode DACs (801-804) has an input terminal "W" for receiving a K-bit control word. By way of example but not limitation, a case of K=2 is shown in DAC 900 in FIG. 9, and it is obvious for those of ordinary skills in the art to generalize the embodiment for a case where K is greater than 2. DAC 900 has a power supply terminal "SRC" for receiving power, an input terminal "W" for receiving a 2-bit control word and two output terminals "I1" and "I2" for outputting two currents. DAC 900 comprises two DAC cells 901 and 902, for receiving control bits W[0] and W[1], respectively. DAC 901 and 902 are constructed in a similar manner, and therefore a description that applies to DAC 901 is also applicable to DAC 902, only the instantiation/labeling is different. In the following descriptions, the instantiation/labeling for DAC 902 is specified in parenthesis. DAC 901 (902) is constructed in a current-steering topology; it comprises a current source embodied by a PMOS (p-channel metal-oxide semiconductor) transistor M3 (M5), and a pair of switches embodied by PMOS transistors M4a and M4b (M6a and M6b). By properly providing a bias voltage VBP1 (VBP2) to the gate of M3 (M5) and a bias voltage to the source of M3 (M5) via the "SRC" terminal, M3 (M5) embodies a current source that outputting a current IS1 (IS2) from its drain, where IS1 (IS2) has approximately a constant level regardless of a state of its load circuit. M4a and M4b (M6a and M6b), as a load circuit to the current IS1 (IS2), forms a switch pair to provide a current-steering function to steer the current IS1 (IS2) either into a first branch IS1a (IS2a) or into a second branch IS1b (IS2b). M4a (M6a) is controlled by W[0] (W[1]), while M4b (M6b) is controlled by a logical inversion of W[0] (W[1]) (the logical inversion is attained using an inverter, 903 for DAC cell 901 and 904 for DAC cell 902). When W[0] (W[1]) is logically low, IS1 (IS2) is steered into the first branch IS1a (IS2a); when W[0] (W[1]) is logically high, IS1 (IS2) is steered into the second branch IS1b (IS2b). All currents from the first branches (IS1a and IS2a) are merged into a first current Ia delivered to the first output terminal I1, while all currents from the second branches (IS1b and IS2b) are merged into a second current Ib delivered to the second output terminal I2.

Figure 10:
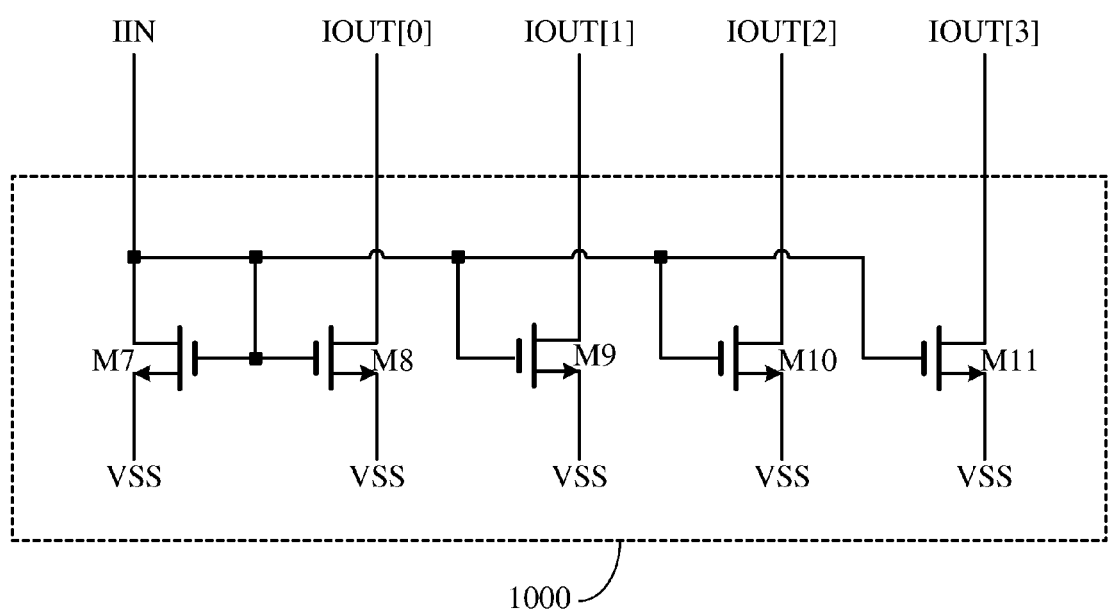
FIG. 10 shows a schematic diagram of a current mirror circuit.

FIG. 10 depicts a current mirror 1000 suitable for embodying current mirrors 811 and 812 of FIG. 8. Current mirror 1000 has an input terminal IIN for receiving an input current signal, and an output terminal IOUT for outputting a plurality of output current signals represented in a bus notation. Current mirror 1000 comprises a first NMOS transistor M7 for receiving the input current from the input terminal IIN, and a plurality of current-mirroring NMOS transistors M8-M11 for mirroring the input current from input terminal IIN into output currents to output terminal IOUT (in a bus notation). Here, VSS denotes a fixed-potential circuit node. The principle of current mirror 1000 is well known in prior art and thus not described in detail here. Also, those of ordinary skill in the art can choose to implement a current mirror in various alternative embodiments. For instance, a "cascode current mirror" topology can be used to improve the output resistance of the current mirror at the cost of reduced output voltage headroom. This and various alternative embodiments can be adopted at the discretion of circuit designers.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A time-interleaved clock data recovery circuit, the circuit comprising:
a time-interleaved sampler/phase-detector circuit for receiving an input signal and a plurality of clock signals, sampling the input signal according to the plurality of clock signals to detect different data transition points of the input signal, and thereby outputting N-bit data and a plurality of phase signals, wherein N is an integer greater than 1;
a control circuit, coupled to the time-interleaved sampler/phase-detector circuit, for receiving the plurality of phase signals and converting the plurality of phase signals into a control signal; and
a controlled oscillator, coupled to the control circuit, for generating the plurality of clock signals under the control of the control signal, wherein the controlled oscillator comprises a digitally-controlled oscillator circuit comprises:
a digitally controlled biasing circuit for receiving the control signal and generating a plurality of biasing signals in response to the control signal; and
a plurality of delay cells for receiving the biasing signals and adjusting the clock signals.

2. The circuit of claim 1, wherein the control circuit comprises:
a plurality of charge-pump circuits, coupled to the time-interleaved sampler/phase-detector circuit, for receiving the phase signals and outputting a plurality of current signals, respectively; and
a filter, coupled to the charge-pump circuits, for converting the current signals into the control signal.

3. The circuit of claim 1, wherein the data rate of the input signal is faster than the frequency of the plurality of clock signals.

4. The circuit of claim 1, wherein the time-interleaved sampler/phase-detector circuit is used to detect different data transition points of the input signal according to the plurality of clock signals.

5. A time-interleaved clock data recovery circuit, the circuit comprising:

a time-interleaved sampler/phase-detector circuit for receiving an input signal and a plurality of clock signals, sampling the input signal according to the plurality of clock signals to detect different data transition points of the input signal, and thereby outputting N-bit data and a plurality of phase signals, wherein N is an integer greater than 1, the time-interleaved sampler/phase-detector circuit further comprising:
  a group of sampling units for sampling the input signal according to the plurality of clock signals, respectively, and outputting a plurality of first binary data;
  a plurality of synchronizing units for sampling the plurality of first binary data, respectively and outputting a plurality of second binary data; and
  a plurality of phase detector logic circuits for receiving the plurality of second binary data and outputting the phase signals;
a control circuit, coupled to the time-interleaved sampler/phase-detector circuit, for receiving the plurality of phase signals and converting the plurality of phase signals into a control signal; and
a controlled oscillator, coupled to the control circuit, for generating the plurality of clock signals under the control of the control signal.

6. A time-interleaved clock data recovery circuit, the circuit comprising:
a time-interleaved sampler/phase-detector circuit for receiving an input signal and a plurality of clock signals, sampling the input signal according to the plurality of clock signals to detect different data transition points of the input signal, and thereby outputting N-bit data and a plurality of phase signals, wherein N is an integer greater than 1;
a control circuit, coupled to the time-interleaved sampler/phase-detector circuit, for receiving the plurality of phase signals and converting the plurality of phase signals into a control signal, the control circuit comprising a plurality of digital loop filters, wherein at least one of the digital loop filters comprises:
  a summing circuit for receiving the corresponding phase signals and outputting a first intermediate signal according to the corresponding phase signals;
  a digital filter having a transfer function for receiving the first intermediate signal and outputting a second intermediate signal; and
  an encoder for encoding the second intermediate signal into the control signal; and
a controlled oscillator, coupled to the control circuit, for generating the plurality of clock signals under the control of the control signal.

7. The circuit of claim 6, the transfer function is set to $H(z)=az^{-1}+bz^{-1}/(1-z^{-1})$.

8. A method of clock data recovery, the method comprising:
generating a plurality of clock signals using a controlled oscillator under a control of a control signal;
sampling an input signal using the plurality of clock signals to generate a plurality of intermediate logical signals;
choosing every other phase in the plurality of clock signals to form a plurality of synchronizing clocks;
sampling the plurality of intermediate logical signals to generate a plurality of groups of synchronized logical signals;
mapping the plurality of groups of synchronized logical signals into a plurality of phase signals, respectively;
generating the control signal according to the phase signals.

9. The method of claim 8, wherein each group includes three synchronized logical signals that are synchronized with one of the plurality of synchronizing clocks.

10. The method of claim 8, further comprising:
converting the plurality of phase signals into a plurality of current signals; and
summing the plurality of current signals into a total current signal.

11. The method of claim 8, wherein the data rate of the input signal is faster than the frequency of the plurality of clock signals.

12. The method of claim 8, further comprising:
generating the plurality of biasing signals in response to the control signal; and
adjusting the clock signals according to the biasing signals.

13. A method of clock data recovery, the method comprising:
receiving an input signal and a plurality of clock signals;
sampling the input signal according to the plurality of clock signals to detect different data transition points of the input signal and thereby outputting N-bit data and a plurality of phase signals, wherein N is an integer greater than 1;
converting the plurality of phase signals into a control signal; and
generating the plurality of clock signals under the control of the control signal, wherein generating the plurality of clock signals comprises:
  generating a plurality of biasing signals in response to the control signal; and
  providing a plurality of delay cells for receiving the biasing signals for adjusting the clock signals.

14. The method of claim 13, wherein the step of converting further comprises:
receiving the phase signals and outputting a plurality of current signals, respectively; and
converting the current signals into the control signal.

15. The method of claim 13, wherein the data rate of the input signal is faster than the frequency of the plurality of clock signals.

16. A method of clock data recovery, the method comprising:
receiving an input signal and a plurality of clock signals;
sampling the input signal according to the plurality of clock signals to detect different data transition points of the input signal and thereby outputting N-bit data and a plurality of phase signals, wherein N is an integer greater than 1;
converting the plurality of phase signals into a control signal, wherein the step of converting further comprises:
  outputting a first intermediate signal according to the corresponding phase signals;
  outputting a second intermediate signal according to the first intermediate signal and a transfer function; and
  encoding the second intermediate signal into the control signal; and
generating the plurality of clock signals under the control of the control signal.

17. The method of claim 16, the transfer function is set to $H(z)=az^{-1}+bz^{-1}/(1-z^{-1})$.

* * * * *